(12) United States Patent
Han et al.

(10) Patent No.: US 12,745,438 B2
(45) Date of Patent: Sep. 22, 2026

(54) SEMICONDUCTOR DEVICE

(71) Applicant: DB HiTek Co., Ltd., Seoul (KR)

(72) Inventors: Yong Shin Han, Incheon (KR); Myeong Bum Pyun, Incheon (KR)

(73) Assignee: DB HiTek Co., Ltd., Seoul (KR)

( * ) Notice: Subject to any disclaimer, the term of this patent is extended or adjusted under 35 U.S.C. 154(b) by 392 days.

(21) Appl. No.: 18/391,219

(22) Filed: Dec. 20, 2023

(65) Prior Publication Data

US 2025/0151349 A1 May 8, 2025

(30) Foreign Application Priority Data

Nov. 6, 2023 (KR) ........................ 10-2023-0151623

(51) Int. Cl.
*H01L 29/06* (2006.01)
*H10D 62/10* (2025.01)
*H10D 62/17* (2025.01)

(52) U.S. Cl.
CPC ......... *H10D 62/126* (2025.01); *H10D 62/393* (2025.01)

(58) Field of Classification Search
CPC ............... H10D 62/126; H10D 62/393; H10D 62/111; H10D 62/107; H10D 30/66; H10D 62/127
See application file for complete search history.

(56) References Cited

U.S. PATENT DOCUMENTS 11,508,819 B2 11/2022 Bobde et al.
2020/0279911 A1* 9/2020 Kim .................... H10D 62/111
2021/0336051 A1 10/2021 Yilmaz
2023/0006037 A1 1/2023 Xiao et al.

FOREIGN PATENT DOCUMENTS

KR 101795828 B1 11/2017

* cited by examiner

*Primary Examiner* — Cuong B Nguyen
(74) *Attorney, Agent, or Firm* — AEON Law, PLLC; Adam L.K. Philipp; Ki Yong O

(57) ABSTRACT

A semiconductor device is provided. The semiconductor device comprises: a substrate comprising an epitaxial layer; a first gate electrode and a second gate electrode disposed on the substrate; a first type body region disposed within the substrate between the first gate electrode and the second gate electrode, a pillar region extending from the first type body region toward a lower surface of the substrate and disposed within the epitaxial layer; and a first region and a second region of the pillar region, each comprising a portion whose width decreases and then increases along a first direction from an upper surface of the substrate toward the lower surface, wherein the first region is disposed between the first type body region and the second region, the first region comprises a first width that is a minimum width of widths of the pillar region and a second width that is greater than the first width, the second region comprises a third width that is greater than the first width and less than the second width, and the first region and the second region are divided with the second width as a boundary.

6 Claims, 8 Drawing Sheets

SEMICONDUCTOR DEVICE

CROSS-REFERENCE TO RELATED APPLICATION

This application claims priority under 35 U.S.C. § 119 to Korean Patent Application No. 10-2023-0151623 filed on Nov. 6, 2023, in the Korean Intellectual Property Office, the entire contents of which is hereby incorporated by reference.

TECHNICAL FIELD

The disclosure relates to a semiconductor device, and more particularly, to a semiconductor device having a super junction structure.

BACKGROUND

The contents set forth in this section merely provide background information on the embodiments and do not constitute prior art.

As one of the high voltage/power semiconductor devices used in power IC devices of power conversion and power control systems, there may be a semiconductor device having a super junction structure.

A semiconductor device having a super junction structure may generate oscillations during the process of turning on or off a power element. Oscillations may cause switching malfunction and/or element destruction. In order to reduce oscillations, it is necessary to reduce the switching speed by increasing the gate resistance and the capacitance of the element (gate-drain capacitance). However, increasing the gate resistance and the capacitance of the element may have the drawback of reducing switching efficiency.

Therefore, there has been a need for a semiconductor device that can reduce oscillations while reducing the capacitance of the element.

The description set forth in the background section should not be assumed to be prior art merely because it is set forth in the background section. The background section may describe aspects or embodiments of the disclosure.

SUMMARY

Aspects of the disclosure provide a semiconductor device that can reduce oscillations of a semiconductor device while having a low capacitance of the semiconductor device.

The objects of the disclosure are not limited to the objects mentioned above, and other objects and advantages of the disclosure that have not been mentioned can be understood by the following description and will be more clearly understood by the embodiments of the disclosure. Further, it will be readily appreciated that the objects and advantages of the disclosure may be realized by the means set forth in the claims and combinations thereof.

According to some aspects of the disclosure, a semiconductor device includes a substrate comprising an epitaxial layer; a first gate electrode and a second gate electrode disposed on the substrate; a first type body region disposed within the substrate between the first gate electrode and the second gate electrode; a pillar region extending from the first type body region toward a lower surface of the substrate and disposed within the epitaxial layer and a first region and a second region of the pillar region, each comprising a portion whose width decreases and then increases along a first direction from an upper surface of the substrate toward the lower surface, wherein the first region is disposed between the first type body region and the second region, the first region comprises a first width that is a minimum width of widths of the pillar region and a second width that is greater than the first width, the second region comprises a third width that is greater than the first width and less than the second width, and the first region and the second region are divided with the second width as a boundary.

According to some aspects, the first region is a region that decreases from a fourth width to the first width along the first direction and then increases from the first width to the second width along the first direction, the second region is a region that decreases from the second width to the third width along the first direction and then increases from the third width to a fifth width along the first direction, and a third region directly below the second region comprises a portion of the pillar region where a width of the pillar region decreases along the first direction from the fifth width.

According to some aspects the first width is less than the fourth width and the fifth width.

According to some aspects the first region is disposed directly below the first type body region, and the second region and the third region are divided with the fifth width as a boundary.

According to some aspects a first thickness of the first region measured along the first direction is greater than a second thickness of the second region measured along the first direction.

According to some aspects the first region is disposed directly below the first type body region.

According to some aspects the second region is disposed directly below the first region.

According to some aspects of the disclosure, a semiconductor device includes a substrate comprising an epitaxial layer; a first gate electrode and a second gate electrode disposed on the substrate; a first type body region disposed within the substrate between the first gate electrode and the second gate electrode; a pillar region extending from the first type body region toward a lower surface of the substrate and disposed within the epitaxial layer; and a first region and a second region of the pillar region, each comprising a portion whose width decreases and then increases along a first direction from an upper surface of the substrate toward the lower surface, wherein the first region is disposed between the first type body region and the second region, and a first thickness of the first region measured along the first direction is greater than a second thickness of the second region measured along the first direction.

According to some aspects the first region comprises a first width that is a minimum width of widths of the pillar region and a second width that is greater than the first width, the second region comprises a third width that is greater than the first width and less than the second width, and the first region and the second region are divided with the second width as a boundary.

According to some aspects the first region is a region that decreases from a fourth width to the first width along the first direction and then increases from the first width to the second width along the first direction, the second region is a region that decreases from the second width to the third width along the first direction and then increases from the third width to a fifth width along the first direction, and a third region directly below the second region comprises a portion of the pillar region where a width of the pillar region decreases along the first direction from the fifth width.

According to some aspects the first width is less than the fourth width and the fifth width.

According to some aspects the first region is disposed directly below the first type body region, and the second region and the third region are divided with the fifth width as a boundary.

According to some aspects the first region is disposed directly below the first type body region.

According to some aspects the second region is disposed directly below the first region.

According to some aspects of the disclosure, a semiconductor device includes a substrate comprising an epitaxial layer; a first gate electrode and a second gate electrode disposed on the substrate; a first type body region disposed within the substrate between the first gate electrode and the second gate electrode; a pillar region extending from the first type body region toward a lower surface of the substrate and disposed within the epitaxial layer; and a first region and a second region of the pillar region, each comprising a portion whose width decreases and then increases along a first direction from an upper surface of the substrate toward the lower surface, wherein the first region is disposed between the first type body region and the second region, the first region comprises a first width that is a minimum width of widths of the pillar region and a second width that is greater than the first width, the second region comprises a third width that is greater than the first width and less than the second width, a first thickness of the first region measured along the first direction is greater than a second thickness of the second region measured along the first direction, and the first region is disposed directly below the first type body region.

According to some aspects the first region is a region that decreases from a fourth width to the first width along the first direction and then increases from the first width to the second width along the first direction, the second region is a region that decreases from the second width to the third width along the first direction and then increases from the third width to a fifth width along the first direction, and a third region directly below the second region comprises a portion of the pillar region where a width of the pillar region decreases along the first direction from the fifth width.

According to some aspects the first width is less than the fourth width and the fifth width.

According to some aspects the second region and the third region are divided with the fifth width as a boundary.

According to some aspects the first region is disposed directly below the first type body region, and the first region and the second region are divided with the second width as a boundary.

According to some aspects the second region is disposed directly below the first region.

Aspects of the disclosure are not limited to those mentioned above and other objects and advantages of the disclosure that have not been mentioned can be understood by the following description and will be more clearly understood according to embodiments of the disclosure. In addition, it will be readily understood that the objects and advantages of the disclosure can be realized by the means and combinations thereof set forth in the claims.

The semiconductor device of the disclosure can lower the capacitance (gate-drain capacitance) of the semiconductor device in a low operating voltage region and increase the capacitance in a high operating voltage region and, thus, can improve the stability and reliability of the operation of the semiconductor device.

In addition to the forgoing, the specific effects of the disclosure will be described together while elucidation the specific details for carrying out the embodiments below.

DETAILED DESCRIPTION OF THE PREFERRED EMBODIMENTS

Figure 1:
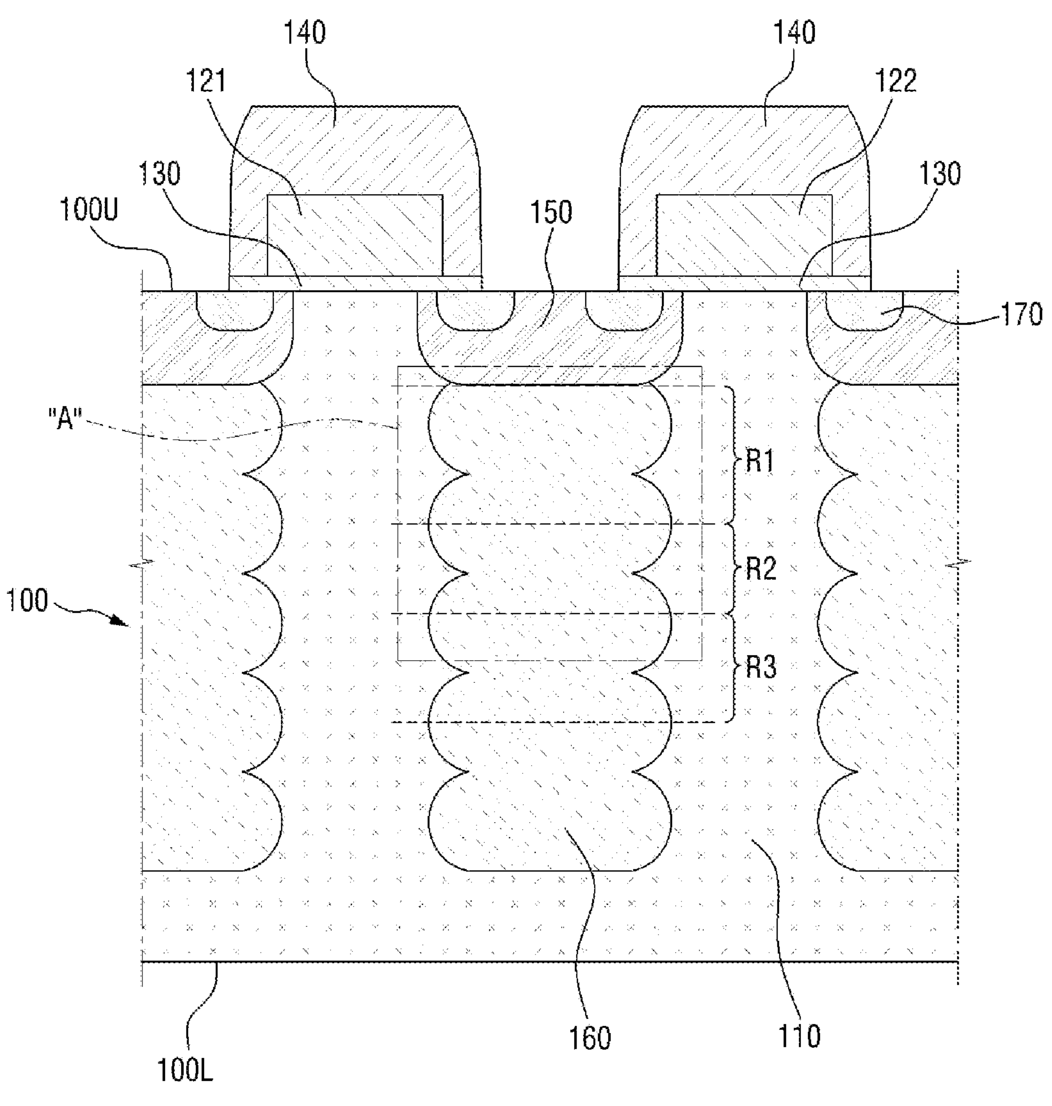
FIG. 1 is a cross-sectional view for describing a semiconductor device in accordance with an embodiment of the disclosure.

The terms or words used in the disclosure and the claims should not be construed as limited to their ordinary or lexical meanings. They should be construed as the meaning and concept in line with the technical idea of the disclosure based on the principle that the inventor can define the concept of terms or words in order to describe his/her own inventive concept in the best possible way. Further, since the embodiment described herein and the configurations illustrated in the drawings are merely one embodiment in which the disclosure is realized and do not real the technical ideas of the disclosure, it should be understood that there may be various equivalents, variations, and applicable examples that can replace them at the time of filing this application.

Although terms such as first, second, A, B, etc. used in the description and the claims may be used to describe various components, the components should not be limited by these terms. These terms are only used to differentiate one component from another. For example, a first component may be referred to as a second component, and similarly, a second component may be referred to as a first component, without departing from the scope of the disclosure. The term 'and/or' includes a combination of a plurality of related listed items or any item of the plurality of related listed items.

The terms used in the description and the claims are merely used to describe particular embodiments and are not intended to limit the disclosure. Singular forms are intended to include plural forms unless the context clearly indicates otherwise. In the application, terms such as "comprise," "comprise," "have," etc. should be understood as not precluding the possibility of existence or addition of features, numbers, steps, operations, components, parts, or combinations thereof described herein.

Unless otherwise defined, the phrases "A, B, or C," "at least one of A, B, or C," or "at least one of A, B, and C" may refer to only A, only B, only C, both A and B, both A and C, both B and C, all of A, B, and C, or any combination thereof.

Unless being defined otherwise, all terms used herein, including technical or scientific terms, have the same meaning as commonly understood by those skilled in the art to which the disclosure pertains.

Terms such as those defined in commonly used dictionaries should be construed as having a meaning consistent with the meaning in the context of the relevant art, and are not to be construed in an ideal or excessively formal sense unless explicitly defined in the application. In addition, each configuration, procedure, process, method, or the like included in each embodiment of the disclosure may be shared to the extent that they are not technically contradictory to each other.

Hereinafter, a semiconductor device in accordance with an embodiment of the disclosure will be described with reference to FIGS. 1 to 8.

FIG. 1 is a cross-sectional view for describing a semiconductor device in accordance with an embodiment of the disclosure.

Referring to FIG. 1, a semiconductor device in accordance with an embodiment of the disclosure may include a substrate 100, an epitaxial layer 110, a first gate electrode 121, a second gate electrode 122, a gate insulating film 130, an interlayer insulating film 140, a first type body region 150, a pillar region 160, and a source region 170.

The substrate 100 may be, for example, bulk silicon or silicon-on-insulator (SOI). Alternatively, the substrate 100 may be a silicon substrate, or may include other materials, for example, silicon germanium, indium antimonide, lead telluride, indium arsenide, indium phosphide, gallium arsenide, or gallium antimonide. The substrate 100 may include an upper surface 100U and a lower surface 100L.

The substrate 100 may include the epitaxial layer 110. The epitaxial layer 110 may include, for example, n-type impurities.

The first gate electrode 121 and the second gate electrode 122 may be disposed on the substrate 100. The first gate electrode 121 and the second gate electrode 122 may be disposed to be spaced apart from each other. The gate insulating film 130 may be disposed between the first gate electrode 121 and the upper surface 100U of the substrate 100 and between the second gate electrode 122 and the upper surface 100U of the substrate 100. The gate insulating film 130 may include an insulating material. The interlayer insulating film 140 may be disposed to surround the first gate electrode 121 and the second gate electrode 122.

The first type body region 150 may be disposed within the substrate 100 between the first gate electrode 121 and the second gate electrode 122. The first type body region 150 may be disposed on top of the pillar region 160. The first type body region 150 may be electrically connected to the pillar region 160. The first type body region 150 may include p-type impurities.

The source region 170 may optionally be disposed on top of the first type body region 150. The source region 170 may include, for example, n-type impurities.

The pillar region 160 may extend from the first type body region toward the lower surface 100L of the substrate 100. The pillar region 160 may be disposed within the epitaxial layer 110. The pillar region 160 may be a region into which p-type dopants are ion-implanted. The pillar region 160 may have a column shape in which p-type ion implantation regions are stacked within the epitaxial layer 110. A plurality of pillar regions 160 may be included in the epitaxial layer 110 of the substrate 100. If a plurality of pillar regions 160 are included in the epitaxial layer 110, each of the plurality of pillar regions 160 may be spaced apart from each other. In this case, the epitaxial layer 110 may be disposed between one pillar region 160 and another pillar region 160.

The pillar region 160 may include a first region R1, a second region R2, and a third region R3. The first region R1 and the second region R2 may be disposed on the third region R3. The second region R2 may be a region between the first region R1 and the third region R3. The first region R1 may be disposed between the first type body region 150 and the second region R2.

In some embodiments, the first region R1 may be disposed directly below the first type body region 150. For example, the first region R1 may be the uppermost part of the pillar region 160. The first region R1 may include an upper end of the pillar region 160. The upper end of the pillar region 160 may be an end adjacent to the upper surface 100U of the substrate 100. The first region R1 may include a boundary between the first type body region 150 and the pillar region 160. The boundary may be, for example, the upper end of the pillar region 160.

Each of the first region R1, second region R2, and third region R3 of the pillar region 160 may include a portion where the cross-sectional width of the pillar region 160 decreases and then increases and a portion where the cross-sectional width increases and then decreases along a first direction from the upper surface 100U toward the lower surface 100L of the substrate 100.

Figure 2:
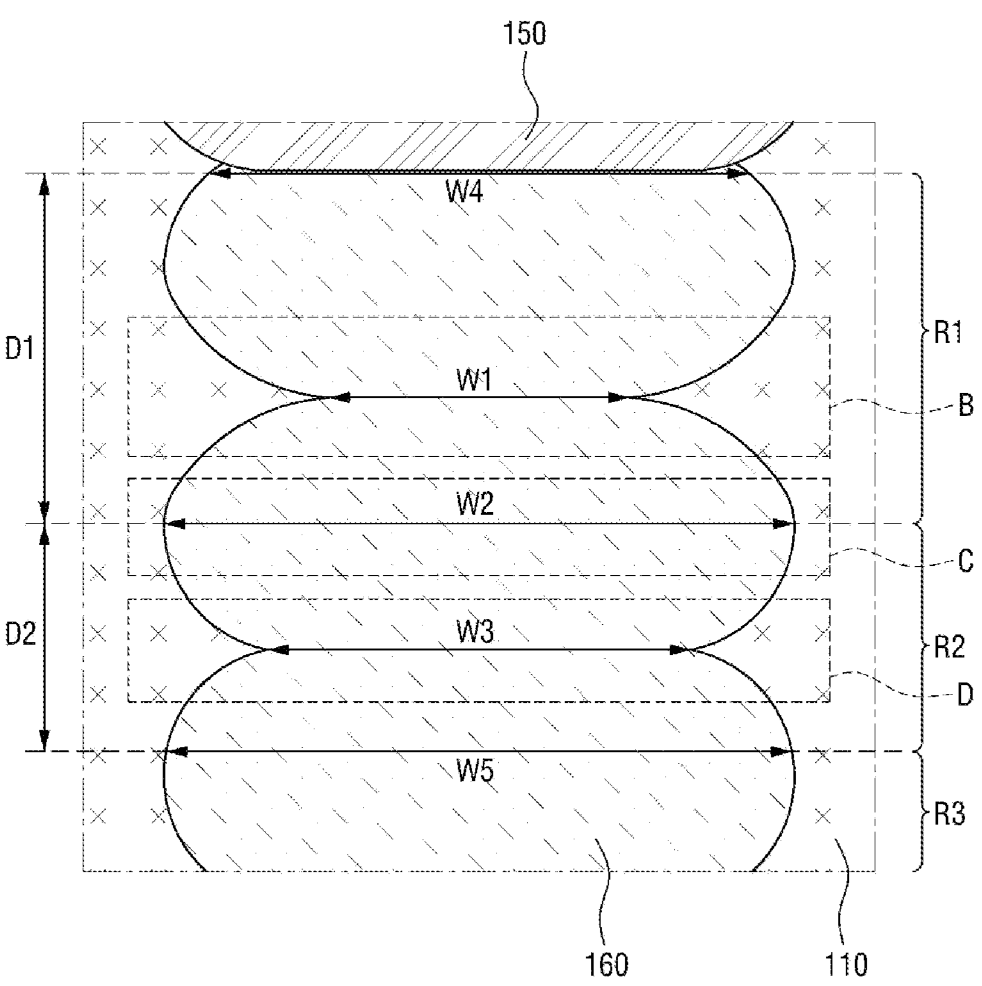
FIG. 2 is an enlarged view of area A of FIG. 1.
Figure 3:
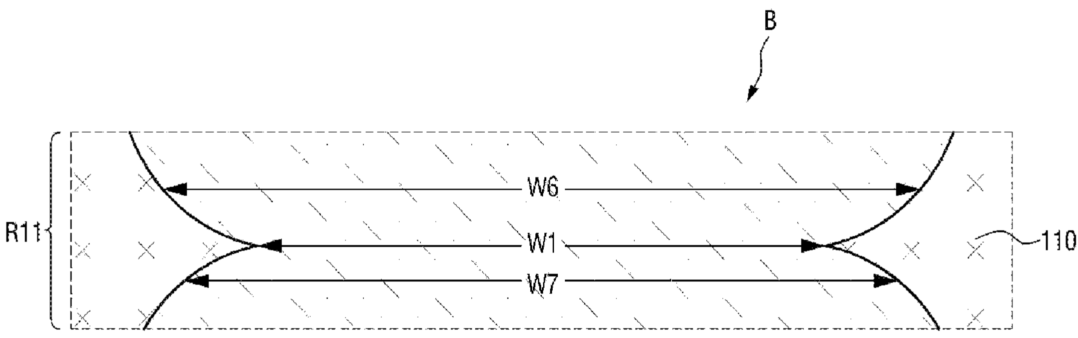
FIG. 3 is an enlarged view of area B of FIG. 2.
Figure 4:
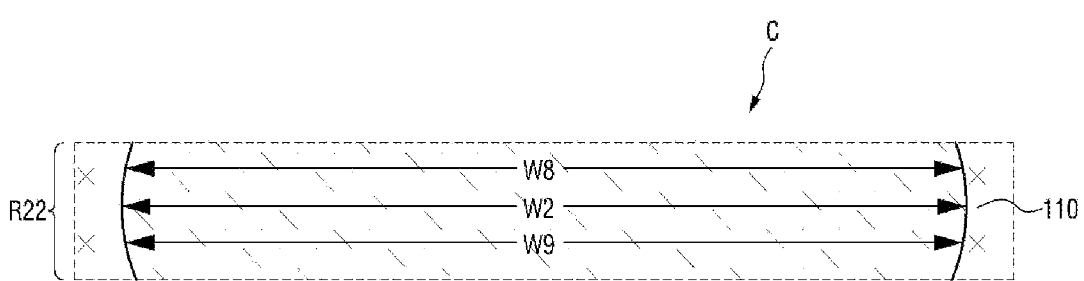
FIG. 4 is an enlarged view of area C of FIG. 2.
Figure 5:
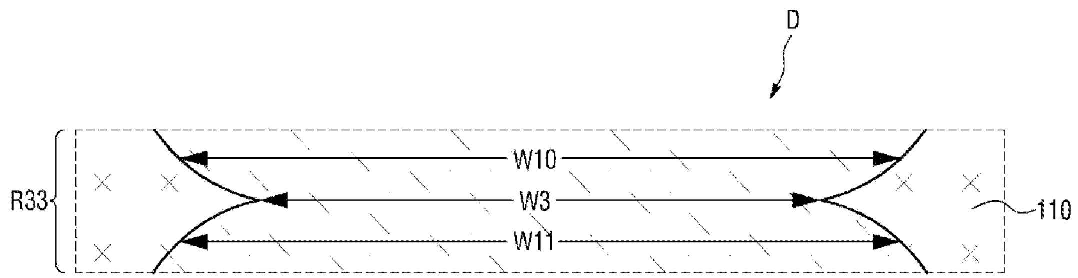
FIG. 5 is an enlarged view of area D of FIG. 2.

FIG. 2 is an enlarged view of area A of FIG. 1. FIG. 3 is an enlarged view of area B of FIG. 2. FIG. 4 is an enlarged view of area C of FIG. 2. FIG. 5 is an enlarged view of area D of FIG. 2.

Referring to FIGS. 1 and 2, the first region R1 of the pillar region 160 of the semiconductor device in accordance with an embodiment of the disclosure may be a region including a first width W1 and a second width W2.

The first width W1 may be the minimum width of the widths of the pillar region 160. The first region R1 of the pillar region 160 may gradually decrease from a fourth width W4, which is the width at the beginning of the pillar region 160, to the first width W1 along the first direction, and may then gradually increase from the first width W1 to the second width W2 along the first direction. The first width W1 may be less than the second width W2. Based on the second width W2, the width of the pillar region 160 may decrease again along the first direction.

The fourth width W4 may be the width at the point where the pillar region 160 begins directly below the first type body region 150. The second width W2 may be the same as or different from the fourth width W4.

Referring to FIG. 3, the first region R1 may include a first portion R11 including the first width W1. The first portion R11 of the first region R1 may include a sixth width W6 and a seventh width W7. Along the first direction, the first portion R11 may decrease from the sixth width W6 to the first width W1 and then increase again to the seventh width W7.

Referring again to FIGS. 1 and 2, the second region R2 may be a region disposed directly below the first region R1.

Referring to FIG. 4, the first region R1 and the second region R2 may be divided with the second width W2 as the boundary. The second portion R22 may include a portion of the first region R1 and a portion of the second region R2. The second portion R22 may include an eighth width W8 and a ninth width W9. The portion of the first region R1 included in the second portion R22 may have the eighth width W8. The portion of the second region R2 included in the second portion R22 may have the ninth width W9. Along the first direction, the second portion R22 may increase from the eighth width W8 to the second width W2 and then decrease again to the ninth width W9.

Referring again to FIGS. 1 and 2, the second region R2 may be a region that starts with the second width W2 and includes a third width W3 and a fifth width W5.

The second region R2 may gradually decrease from the second width W2 to the third width W3 along the first direction, and then gradually increase from the third width W3 to the fifth width W5 along the first direction. The third width W3 may be greater than the first width W1 and less than the second width W2 and the fourth width W4. The fifth width W5 may be greater than the first width W1 and the third width W3. The fifth width W5 may be the same as or different from each of the second width W2 and the fourth width W4.

Referring to FIG. 5, the second region R2 may include a third portion R33 including the third width W3. The third portion R33 of the second region R2 may include a tenth width W10 and an eleventh width W11. Along the first direction, the third portion R33 may decrease from the tenth width W10 to the third width W3 and then increase again to the eleventh width W11.

Referring again to FIGS. 1 and 2, the third region R3 may include at least a portion of the pillar region 160 below the second region R2 starting with the fifth width W5. The third region R3 may be disposed directly below the second region R2. The second region R2 and the third region R3 may be divided with the fifth width W5 as the boundary. The third region R3 may include a portion of the pillar region 160 whose width decreases from the fifth width W5 along the first direction.

A first thickness D1 of the first region R1 measured along the first direction may be greater than a second thickness D2 of the second region R2 measured along the first direction. For example, the thickness of a portion of the epitaxial layer 110 corresponding to the first region R1 (e.g., first thickness D1) may be greater than the thickness of another portion of the epitaxial layer 110 corresponding to the second region R2 (e.g., the second thickness D2).

For example, the thickness in the first direction from the portion having the fourth width W4 to the portion having the second width W2 of the pillar region 160 may be the first thickness D1. The portion having the fourth width W4 may be the portion where the pillar region 160 begins from the first type body region 150. The second width W2 may be the width when the width is increased maximally from the first width W1 when the width gradually decreases from the fourth width W4 to the first width W1 along the first direction, then gradually increases again from the first width W1, and then begins to decrease again.

For example, the thickness in the first direction from the portion having the second width W2 to the portion having the fifth width W5 of the pillar region 160 may be the second thickness D2. The fifth width W5 may be the width when the width is increased maximally from the third width W3 when the width gradually decreases from the second width W2 to the third width W3 along the first direction, then gradually increases again from the third width W3, and then begins to decrease again.

Figure 6:
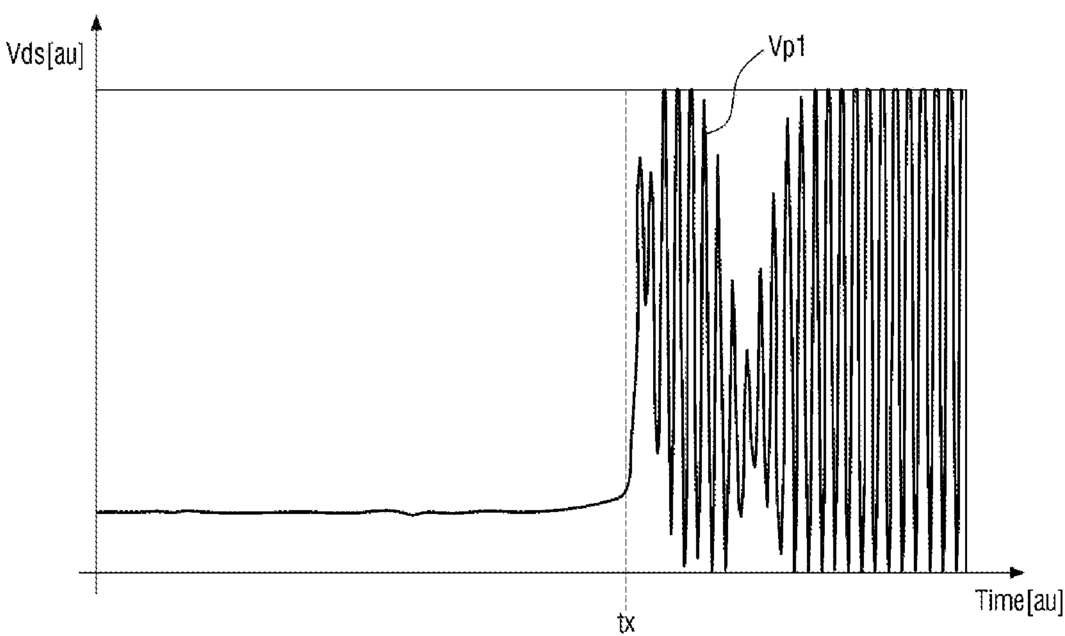
FIGS. 6, 7, and 8 are diagrams for describing the effects of a semiconductor device in accordance with an embodiment of the disclosure.
Figure 7:
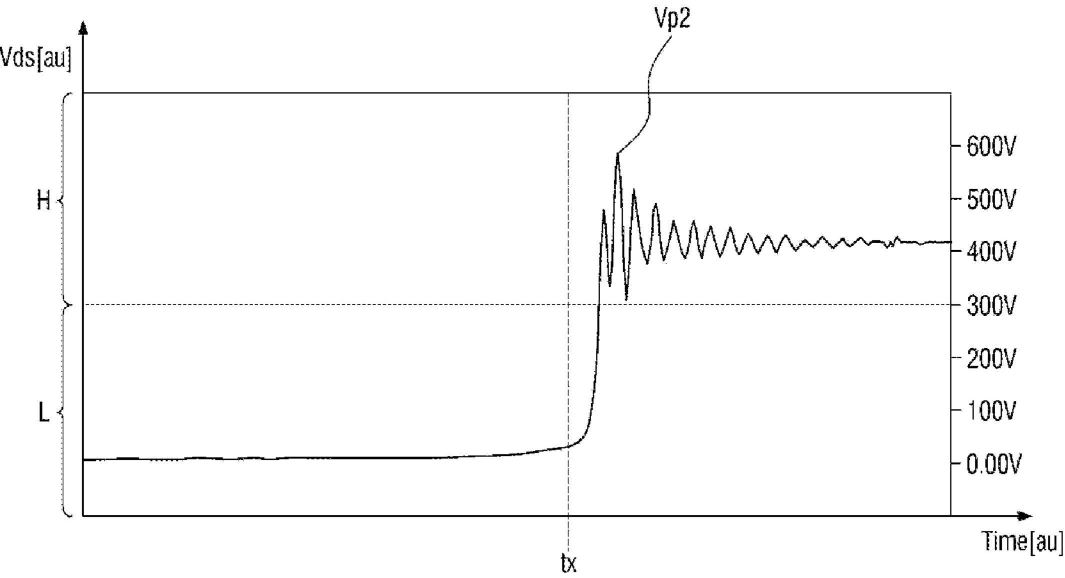
Figure 8:
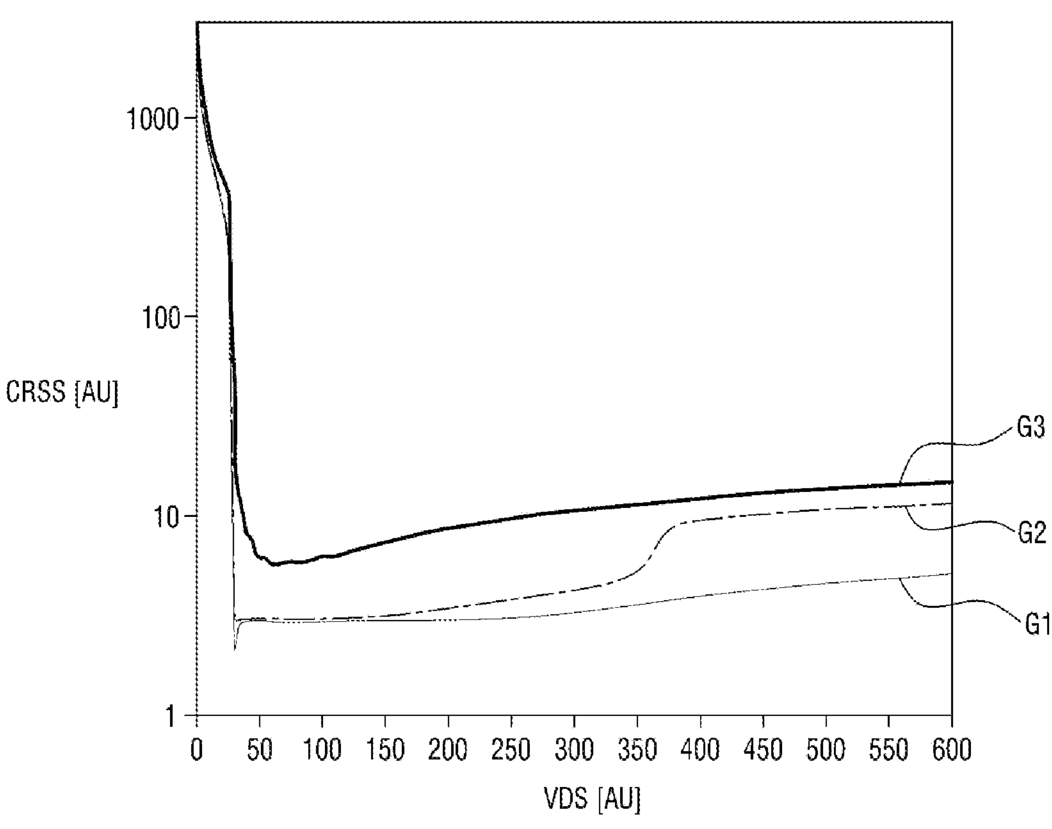

FIGS. 6, 7, and 8 are diagrams for describing the effects of a semiconductor device in accordance with an embodiment of the disclosure.

The x-axis of the graphs shown in FIGS. 6 and 7 may be time (unit: AU (arbitrary unit)), and the y-axis may be voltage (unit: AU). The x-axis of the graph shown in FIG. 8 may be voltage (unit: AU), and the y-axis may be capacitance (Crss (unit: AU)).

Referring to FIG. 6, if the first region R1 does not include the first width W1 that is the minimum width and the first thickness D1 is not greater than the second thickness D2, the semiconductor device may generate oscillations after a particular time (e.g., tx) in both the low voltage region and the high voltage region. In this case, a first peak voltage Vp1 may occur after the particular time.

Referring to FIG. 7, if the first region R1 includes the first width W1 that is the minimum width and the first thickness D1 is greater than the second thickness D2, the semiconductor device operates stably in the low voltage region L and generates oscillations in the high voltage region H, but may have a second peak voltage Vp2 that is lower than the first peak voltage Vp1 of FIG. 6. Directly below the first type body region 150, by getting the first region R1 around which the pillar region 160 begins to include the minimum width (first width W1) of the pillar region 160, oscillations of the semiconductor device can be reduced.

Referring to FIG. 8, the first graph G1 is a graph showing the capacitance of the semiconductor device in which a portion of the pillar region 160 corresponding to the first region R1 of the semiconductor device in accordance with an embodiment of the disclosure has a width greater than the first width W1, and the thickness of the portion of the pillar region 160 corresponding to the first region R1 of the semiconductor device in accordance with an embodiment of the disclosure is not greater than the thickness of other regions. The second graph G2 is a graph showing the capacitance of the semiconductor device in which the portion of the pillar region 160 corresponding to the first region R1 of the semiconductor device in accordance with an embodiment of the disclosure has a minimum width equal to the first width W1, but the thickness of the portion of the pillar region 160 corresponding to the first region R1 of the semiconductor device in accordance with an embodiment of the disclosure is not greater than the thickness of other regions. The third graph G3 is a graph showing the capacitance of the semiconductor device in accordance with an embodiment of the disclosure.

According to the third graph G3, the semiconductor device in accordance with an embodiment of the disclosure exhibits an overall higher capacitance compared to the semiconductor device of the first graph G1 and the semiconductor device of the second graph G2. According to the third graph G3, the semiconductor device in accordance with an embodiment of the disclosure has an increasing capacitance as voltage changes from low voltage to high voltage compared to the semiconductor device of the first graph G1 and the semiconductor device of the second graph G2.

The semiconductor device in accordance with an embodiment of the disclosure can lower the capacitance at low voltages and increase the capacitance at high voltages, and thus, can improve the stability and reliability of the operation of the semiconductor device.

The foregoing description is merely illustrative of the technical spirit of the embodiment. It will be appreciated by those skilled in the art that various modifications and alterations can be made without departing from the essential characteristics of the embodiment. Therefore, the embodiments of the disclosure have not been described for limiting purposes, and the scope of the spirit of the disclosure is not limited by these embodiments. The protection range of the embodiment should be construed by the claims below, and all technical ideas within an equivalent range thought should be construed as being included within the scope of the embodiment.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims. It is therefore desired that the embodiments be considered in all respects as illustrative and not restrictive, reference being made to the appended claims rather than the foregoing description to indicate the scope of the disclosure.

What is claimed is:

1. A semiconductor device comprising:

a substrate comprising an epitaxial layer;

a first gate electrode and a second gate electrode disposed on the substrate;

a first type body region disposed within the substrate between the first gate electrode and the second gate electrode;

a pillar region extending from the first type body region toward a lower surface of the substrate and disposed within the epitaxial layer; and a first region and a second region of the pillar region, each comprising a portion whose width decreases and then increases along a first direction from an upper surface of the substrate toward the lower surface, wherein the first region is disposed between the first type body region and the second region, the first region comprises a first width that is a minimum width of widths of the entire pillar region, and comprises a second width that is greater than the first width, the second region comprises a third width that is greater than the first width and less than the second width, a first thickness of the first region measured along the first direction is greater than a second thickness of the second region measured along the first direction, and the first region is disposed directly below the first type body region and the second region has only widths greater than the first width.

2. The semiconductor device of claim 1, wherein the first region is a region that decreases from a fourth width to the first width along the first direction and then increases from the first width to the second width along the first direction, the second region is a region that decreases from the second width to the third width along the first direction and then increases from the third width to a fifth width along the first direction, and a third region directly below the second region comprises a portion of the pillar region where a width of the pillar region decreases along the first direction from the fifth width.

3. The semiconductor device of claim 2, wherein the first width is less than the fourth width and the fifth width.

4. The semiconductor device of claim 2, wherein the second region and the third region are divided with the fifth width as a boundary.

5. The semiconductor device of claim 1, wherein the first region is disposed directly below the first type body region, and the first region and the second region are divided with the second width as a boundary.

6. The semiconductor device of claim 1, wherein the second region is disposed directly below the first region.

* * * * *